(12) United States Patent
Taniguchi et al.

(10) Patent No.: US 6,683,349 B1
(45) Date of Patent: Jan. 27, 2004

(54) SEMICONDUCTOR DEVICE AND METHOD OF MANUFACTURING THE SAME

(75) Inventors: Toshimitsu Taniguchi, Gunma (JP); Takashi Arai, Tochigi (JP); Masashige Aoyama, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/652,892

(22) Filed: Aug. 31, 2000

(30) Foreign Application Priority Data

Oct. 29, 1999 (JP) ............................................. 11-309364

(51) Int. Cl.7 ........................... H01L 29/76; H01L 29/94
(52) U.S. Cl. ........................ 257/342; 257/344; 257/346
(58) Field of Search .......................... 257/342, 344, 257/346

(56) References Cited

U.S. PATENT DOCUMENTS

| | | | | |
|---|---|---|---|---|
| 5,780,912 A | * | 7/1998 | Burr et al. ................... | 257/408 |
| 5,874,768 A | * | 2/1999 | Yamaguchi et al. ......... | 257/493 |
| 6,087,232 A | * | 7/2000 | Kim et al. .................... | 438/289 |
| 6,215,152 B1 | * | 4/2001 | Hebert ........................ | 257/340 |
| 6,242,787 B1 | * | 6/2001 | Nakayama et al. .......... | 257/493 |

FOREIGN PATENT DOCUMENTS

| GB | 2062349 A | * | 5/1981 |
|---|---|---|---|
| JP | 2000312002 | * | 11/2000 |

* cited by examiner

*Primary Examiner*—Eddie Lee
*Assistant Examiner*—Joseph Nguyen
(74) *Attorney, Agent, or Firm*—Fish & Richardson P.C.

(57) ABSTRACT

A semiconductor device includes a gate electrode 16 on a P type well through a gate oxide film 9, a heavily-doped N+ type source layer 12 formed to be adjacent to the one end of the gate electrode 16, an N+ type drain layer 12 formed apart from the other end of the gate electrode 16, a P type body layer 14 below the gate electrode 16, and a lightly-doped drain layer 10 formed in an area extending from below the gate electrode 16 to the heavily-doped N+ type drain layer 12 so that it is shallow at least below the gate electrode 16 and deep in the vicinity of the heavily-doped N-type drain layer 12.

7 Claims, 6 Drawing Sheets

$B^+ = 1 \times 10^{17}/cm^3$ $P^+ = 6 \times 10^{16}/cm^3$ $As^+ = 1 \times 10^{17}/cm^3$

Fig.7

SEMICONDUCTOR DEVICE AND METHOD OF MANUFACTURING THE SAME

BACKGROUND OF THE INVENTION

1. Field of the Invention

The present invention relates to a semiconductor device and a method of manufacturing it, and more particularly to technology of a high withstand voltage MOS transistor that is applied to e.g. an IC for driving liquid crystal.

2. Description of the Related Art

Now referring to the drawings, an explanation will be given of a conventional semiconductor device and a method of manufacturing it.

As a high withstand voltage element applied to the IC for driving liquid crystal, e.g. an LD (Lateral Double diffused) MOS transistor structure has been proposed. This DMOS transistor structure refers to an element in which impurities of a different conduction type are diffused into a diffused layer previously formed on the surface side of a semiconductor substrate to form new diffused layers and a difference of diffusion in the lateral direction between the diffused layers is used as an effective channel length. It forms a short channel and hence is suited to realize a low ON-resistance.

Figure 7:
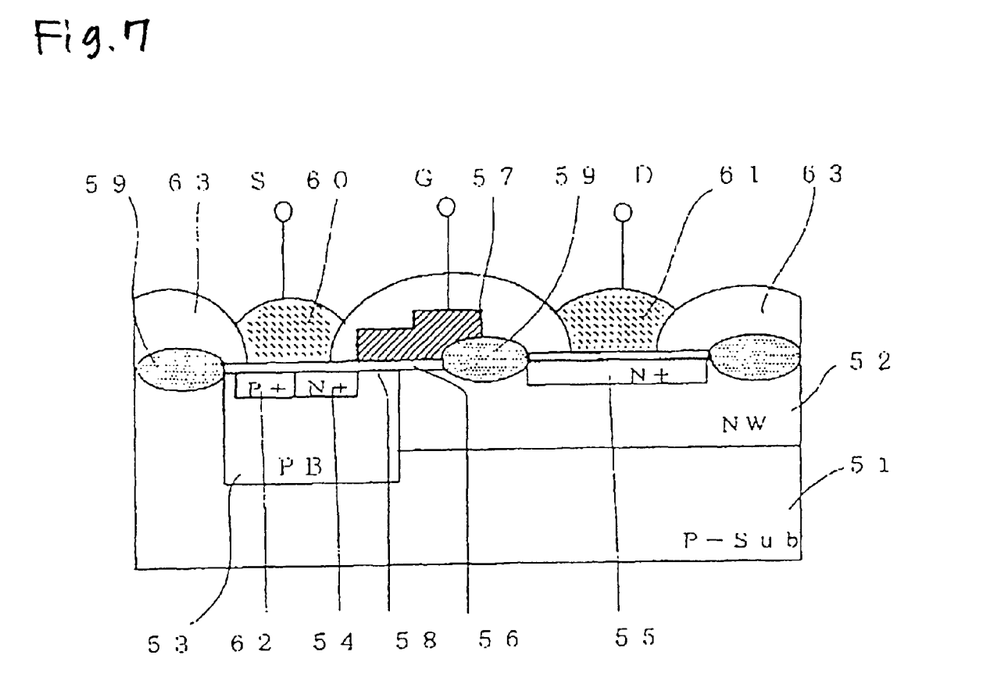
FIG. 7 is a sectional view showing a conventional semiconductor device.

FIG. 7 is a sectional view for explaining a conventional DMOS transistor illustrated in an N-channel type DMOS transistor structure. Although no explanation will be given of a P-channel type DMOS transistor structure, as well known, it can have the same structure as the N-channel type DMOS transistor structure.

In FIG. 7, reference numeral 51 denotes a semiconductor substrate of one conduction type, e.g. P type. Reference numeral 52 denotes an N type well within which a P type body layer 53 is formed. An N type diffused layer 54 is formed within the P type body layer 53. An N type diffused layer 55 is formed within the N type well 52. A gate electrode 57 is formed on a substrate surface through a gate oxide film 56. A channel layer 58 is formed in the surface layer of the P type body layer 53 immediately below the gate electrode 57.

The N type diffused layer 54 serves as a source diffused layer, the N type diffused layer 55 serves as a drain diffused layer and the N type well 52 below a LOCOS oxide film 59 serves as a drift layer. Reference numerals 60 and 61 denote a source electrode and a drain electrode, respectively. Reference numeral 62 denotes a P type diffused layer for taking the potential of the P type body layer 53. Reference numeral 63 denotes an interlayer insulating film.

An explanation will be given of a method of manufacturing the above DMOS transistor structure. N type impurities are ion-implanted into the semiconductor substrate 51 to form the N type well 52. After the gate oxide film 56 has been formed on the substrate 51, the gate electrode 57 is formed through the gate oxide film 56. Using the gate electrode 57 as a mask, the P type impurities are ion-implanted and diffused to form the P type body layer 53. Thereafter, the N type diffused layers 54 and 55 are formed.

In the DMOS transistor described above, since the N type well 52 is formed by diffusion, the dopant density on the surface of the N type well 52 becomes high, thereby facilitating a current flow on the surface of the N type well 52 and realizing high withstand voltage.

The DMOS transistor having the structure described above is referred to as a relaxing-surface type (Reduced SURface Field:RESURF) DMOS in which the dopant density of the drift layer of the N type well 52 is set so as to satisfy the RESURF requirement. Such technology is disclosed in JP-A-9-139438.

In the above DMOS transistor structure, as seen from FIG. 7, the N type well 52 is uniformly formed to have the same depth. This was an obstacle against realization of a higher withstand voltage and further reduction of the ON resistance.

Further, since the P type body layer 53 is formed to surround the entire N-type diffused layer 54, there is a problem that the junction capacitance at this region is disadvantageously increased.

SUMMARY OF THE INVENTION

A first object of the invention is to provide a semiconductor device with endurance to a high voltage and reduced ON resistance.

A second object of the invention is to provide a method of manufacturing such a semiconductor device.

In order to attain the above object, the semiconductor device according to the invention includes a gate electrode on a P type well through a gate oxide film, a heavily-doped N type source layer formed so as to be adjacent to the one end of the gate electrode, an N type drain layer formed apart from the other end of the gate electrode, a P type body layer below the gate electrode, and a lightly-doped drain layer formed in an area extending from below the gate electrode to the heavily-doped N type drain layer so that it is shallow at least below the gate electrode and deep in the vicinity of the heavily-doped N type drain layer.

The semiconductor device according to the invention is manufactured as follows.

First, two kinds of N type impurities are ion-implanted into a P type well to form an N type lightly doped drain layer in a later step. Thereafter, a certain region on the P type well is selectively oxidized to form a local oxidation film and to form lightly-doped N type layers at a relatively shallow or surface position and a relatively deep position in the P type well, respectively on the basis of a difference in a diffusion coefficient between the two kinds of N type impurities. Using a resist film formed on the P type well on a region where a drain is to be formed, P type impurities are ion-implanted in the P type well of a region where a source is to be formed, and thereafter diffused so that the N type layer formed at the deep position in the P type well of the region where the source is to be formed is canceled by the diffused P type impurities, thereby forming a lightly-doped N type drain layer which comprises a first N type layer formed at a shallower position and a second N type layer formed at a deep position. N type impurities are ion-implanted in the P type well to form a heavily-doped source layer so as to be adjacent to the one end of a gate electrode to be formed in a later step and a heavily-doped N type drain layer at a position apart from the other end of the gate electrode. Further, P type impurities are ion-implanted in the P type well to form a P type body layer from below the one end of the gate electrode so as to be adjacent to the N type source layer. Finally, the gate electrode is formed on the gate oxide film which is formed on the N type well.

The above and other objects and features of the invention will be more apparent from the following description taken in conjunction with the accompanying drawings.

DESCRIPTION OF THE PREFERRED EMBODIMENTS

Now referring to the drawings, an explanation will be given of an embodiment of a semiconductor device and a method of manufacturing it according to the invention.

Figure 3:
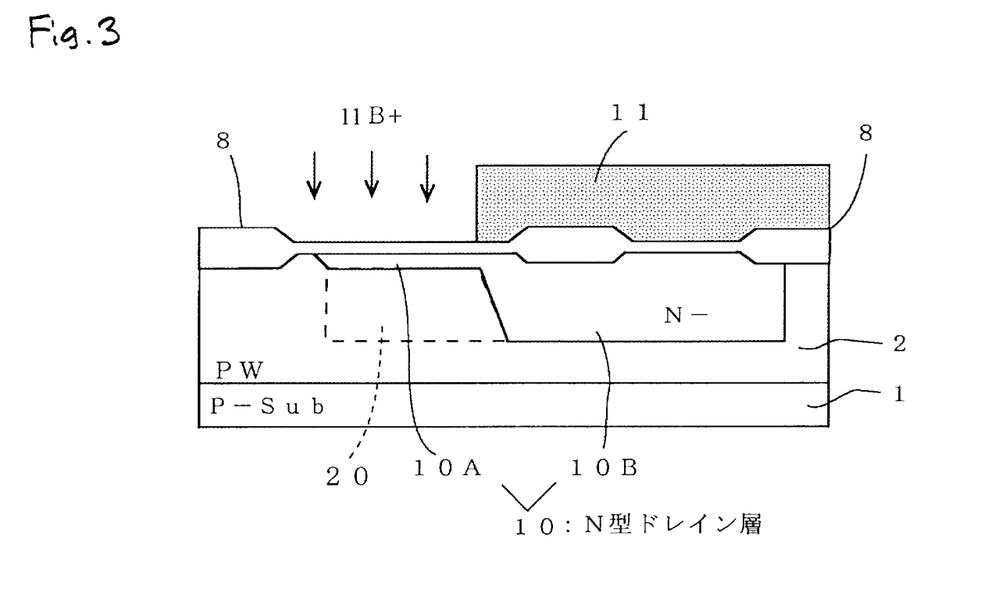

FIGS. 5A and 5B are sectional views showing a high withstand voltage MOS transistor according to the invention, which is illustrated as an N-channel type MOS transistor structure. Although no explanation will be given of a P-channel type MOS transistor structure, as well known, it can have the same structure as the N-channel type MOS transistor structure. FIG. 5A is an X—X sectional view of FIG. 5B, in gate width direction. In FIGS. 5A and 5B, reference numerals 1 and 2 denote e.g. a P type semiconductor substrate (P-Sub) and a P type well(PW), respectively. A gate electrode 16 is formed on the P type well 2 through a gate oxide film 9. A heavily-doped N type source layer 12 is formed adjacently to the one end of the gate electrode 16 and a heavily-doped N type drain layer (N+layer) 12 is formed at a position apart from the other end of the gate electrode 16. An P type body layer 14 (PB) is formed below the gate electrode 16 on the side of the source layer 12. In an area extending from below the gate electrode 16 to the heavily-doped N type drain layer 12, a lightly-doped N type drain layer 10 is formed so as to be shallow (first N− layer 10A) below the gate electrode 16 and deep (second N− layer 10B) in the vicinity of the N type drain layer (FIG. 3). Although not illustrated, a source and a drain electrode are formed in contact with the N type source/drain layers 12 through an interlayer insulating film, respectively. Reference numeral 17 is a P type diffused layer so as to be adjacent to the N type source layer 12 for taking the electric potential of the P type body layer 14.

As described above, the feature of the invention resides in that the N− layer (lightly-doped N type drain layer) 10 is formed within the P type well so as to be shallow (first N− layer 10A) below the gate electrode 16 and deep (second N− layer 10B) in the vicinity of the N type drain layer 12 (FIG. 3).

Because of such a configuration, the first N− layer 10A formed to be shallow below the gate electrode 16 has a relatively high carrier concentration, thereby has a high carrier mobility, which decreases the ON resistance so that a current is likely to flow. On the other hand, the second N− layer 10B formed to be deep in the vicinity of the drain layer 12 has a relatively low dopant concentration, thereby has a high carrier mobility, which easily extends the depletion layer to realize endurance to a high voltage (see the graph of distribution of impurity concentrations shown in FIG. 6). In the present invention, endurance to a high voltage, about 30 V, can be obtained.

In addition, the structure of the present invention in which the P type body layer 14 is formed only below the gate electrode 16 can reduce the junction capacitance and hence is efficient for a high speed operation in comparison to the conventional structure (shown in FIG. 7) in which the entire heavily-doped N type source layer 54 is surrounded by the P type body layer 53.

An explanation will be given of a method of manufacturing a method of manufacturing the N-channel type DMOS transistor.

Figure 1:
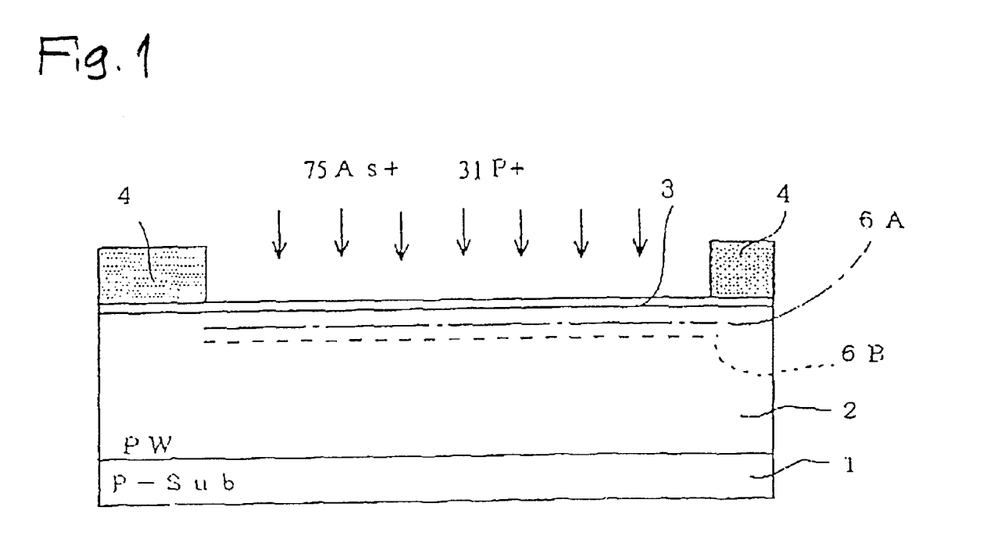
FIGS. 1 to 5 are sectional views showing a method of manufacturing a semiconductor device according to an embodiment of the invention.

First, in FIG. 1, a pad oxide film 3 is formed on a P type well formed within a P type semiconductor substrate 1. Thereafter, using a resist film 4 as a mask, two kinds of N type impurities (e.g. arsenic (As) ions and phosphorus (P) ions) for forming an N− layer 10 (FIG. 3) constituting a lightly-doped drain layer in a later step are ion-implanted to form a first and a second ion-implanted layer 6A and 6B. In this step, the arsenic (As) ions are implanted at an accelerating voltage of about 160 KeV and a dose of $3\times10^{12}/cm^2$ and the phosphorus (P) ions are implanted with a dose of $4\times10^{12}/cm^2$ at an accelerating voltage of about 50 KeV.

Figure 2:
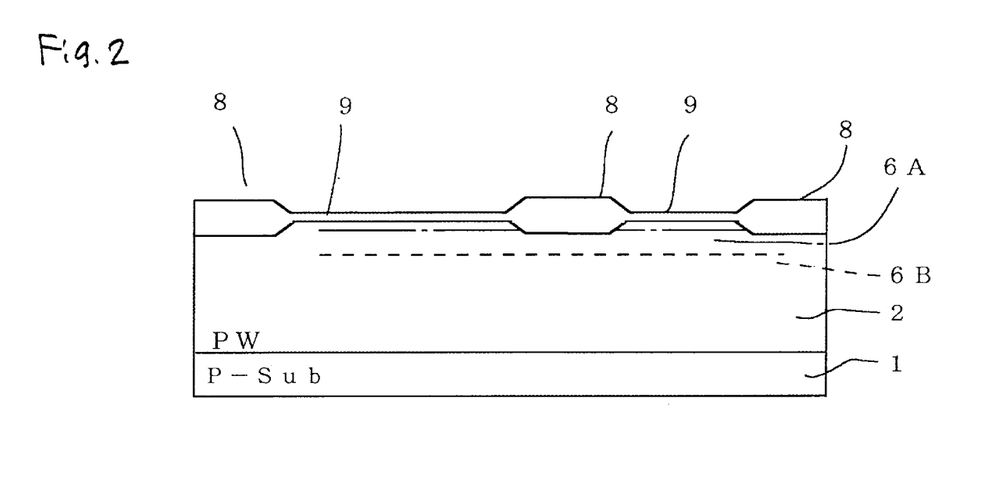

In FIG. 2, using the silicon nitride film (not shown) formed on the substrate 1 as a mask, a certain region on the substrate surface is selectively oxidized by the LOCOS technique to form a local oxidation film 8 having a thickness of about 730 nm according to heating treatment at 1000° C. for 4 hours (which constitutes a part of an element isolation film and gate oxide film). Further gate insulating film 9 having 80 nm thickness of gate insulating film 9 is formed on the substrate surface except for an area covered with the local oxidation film 8.

In FIG. 3, a resist film 11 is formed on the area where a drain is to be formed in the P type well 2. Thereafter, using the resist film 11 as a mask, the P type impurities (e.g. boron (B) ions) are ion-implanted in the surface layer of the P type well 2 in a region where a source is to be formed, and subsequently diffused into the surface layer. Thus, the phosphorus (P) ions constituting the second N− layer 10B in the region where the source is to be formed are canceled by the diffused boron ions so that the second N− layer 10B in the region where the source is to be formed disappears. In this step, actually, for example, the boron ions are implanted with a dose of $8\times10^{12}/cm^2$ at an accelerating voltage of about 80 KeV and thereafter thermally diffused for two hours at a temperature of about 1100° C.

In this step, because of a difference in the diffusion coefficient between three kinds of ions, the boron ions, the arsenic (As) ions and phosphorus (P) ions, such a N-drain layer 10 having different depths.

Namely, because of a difference in the diffusion coefficient between the arsenic (As) ions and phosphorus (P) ions which have been implanted in the surface layer of the P type well 2, the Arsenic ions are diffused into the P type well 2 to form a first N− layer 10A at a relatively shallow position, and the phosphorus ions are diffused into the P type well to form a second N− layer 10B at a relatively deep position. And the Phosphorus ions diffused into the P type well to form a second N− layer 10B are cancelled by the Boron ions to be eliminated. Thereby the first N− layer 10A is formed at a relatively shallow position.

Figure 6:
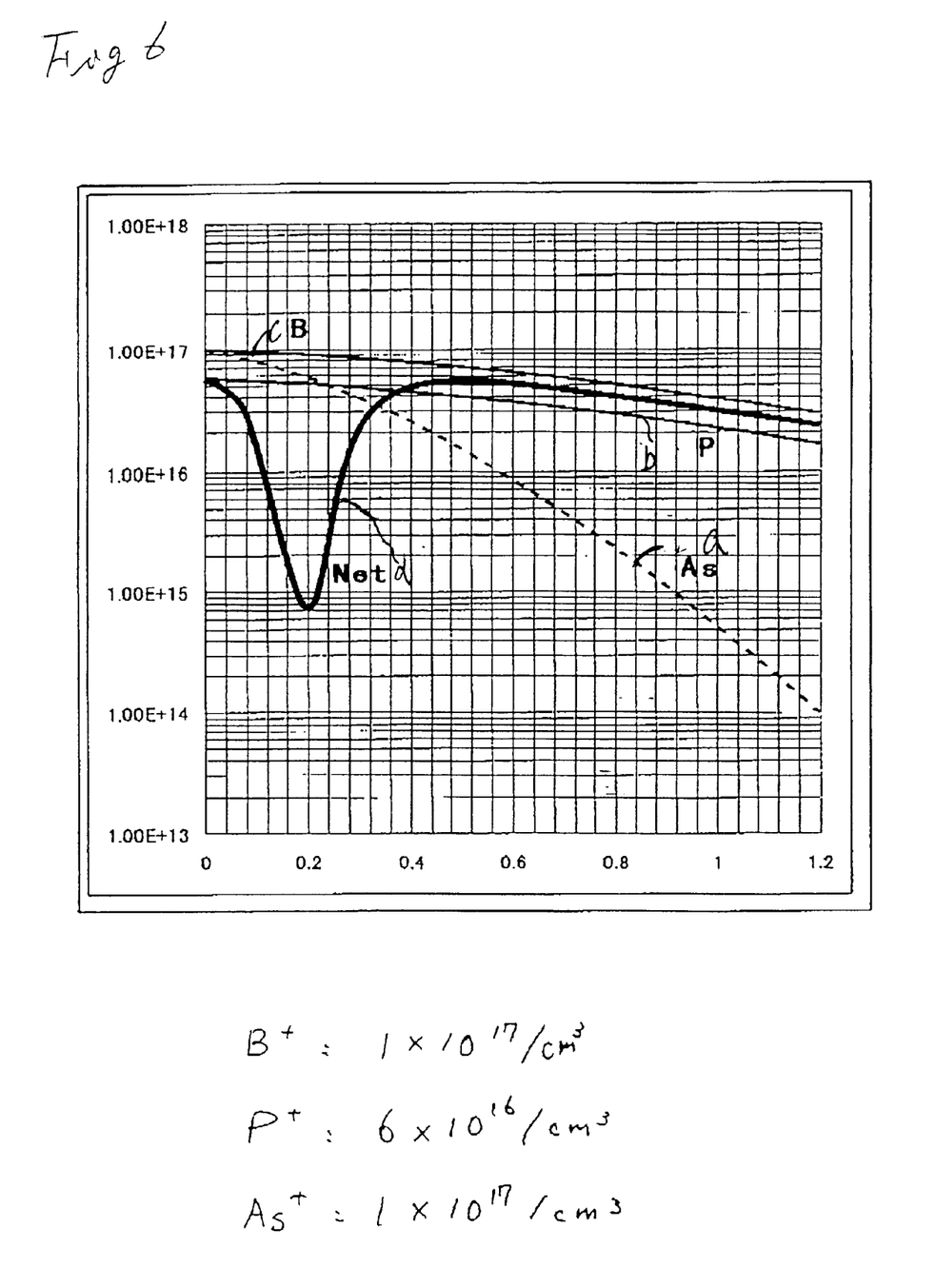
FIG. 6 is a graph showing the distribution of concentrations of various ions for explaining a method of manufacturing a semiconductor device according to an embodiment of the invention.

FIG. 6 is a graph showing the distribution of the impurity concentrations when the Arsenic ions (indicated by line a), Phosphorus ions (indicated by line b) and Boron ions (indicated by line c) have been diffused, respectively. As seen from the graph, the concentration distribution originating from the Phosphorus ions in the substrate is canceled by that originating from the Boron ions. N type impurity concentration distribution of the substrate caused by Phosphorus ions is overwrapped and cancelled by P type impurity concentration distribution caused by Boron ions.

In this way, in accordance with the invention, when the lightly doped N type drain layer (N− layer 10) is formed, the second N− layer 10B is formed at a deep position of the substrate by using the difference in the diffusion coefficient between the Arsenic ions and Phosphorus ions. The second N− layer 10B formed at a deep position of the substrate on the side of the region where the source is to be formed is canceled by diffusing the Boron ions whose diffusion coefficient is substantially equal to same as that of Phosphorus ions. Thus, on the side of the region where the source is to be formed, only the first N− layer 10A formed in the surface layer remains. Accordingly, the semiconductor device with the ON resistance reduced can be manufactured through a relatively simple manufacturing process.

Further according to a function of Boron ions for canceling, shown by dashed line in FIG. 5A, depletion layer of drain layer (N− layer 10B) can be suppressed to extend.

Figure 4:
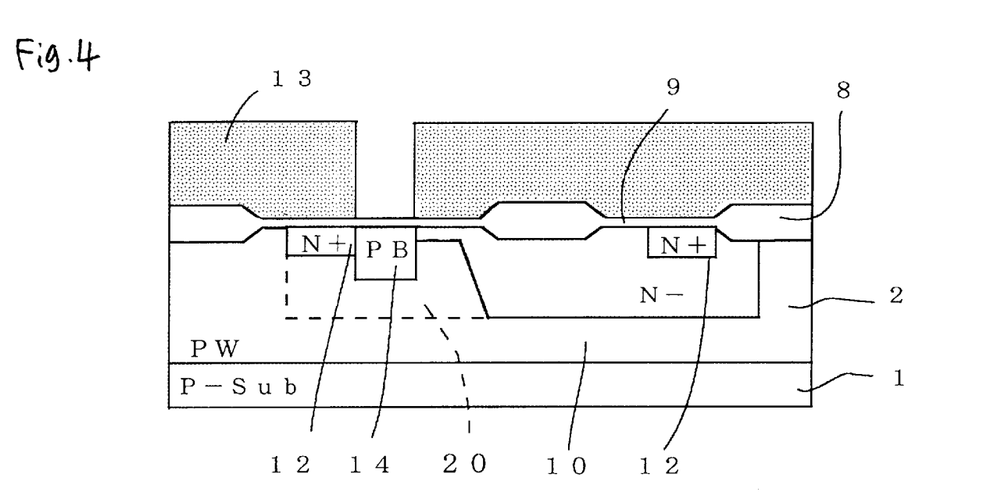

Further, in FIG. 4, using a resist film as a mask, N type impurities are ion-implanted to form N+ layers (hereinafter referred to as heavily doped source/drain layers 12). Specifically, in a state where the other region than the region where the heavily doped source/drain layers are to be formed is covered with the resist film, for example, Phosphorus ions are ion-implanted into the substrate surface layer with a dose of $2 \times 10^{15}/cm^2$ at an accelerating voltage of about 80 KeV so that the heavily-doped N type source/drain layers 12 are formed.

Using a resist film 13 as a mask, P type impurities are ion-implanted through the N− layer 10A so that a P type body (PB) layer 14 is formed so as to be adjacent to the N type source layer 12. Specifically, in a state where the other region than the region where the P type body layer is to be formed is covered with the resist film 13, for example, boron difluoride ions are ion-implanted into the substrate surface layer with a dose of $3 \times 10^{12}/cm^2$ at an accelerating voltage of about 120 KeV so that the P type body layer 14 is formed.

Figure 5:
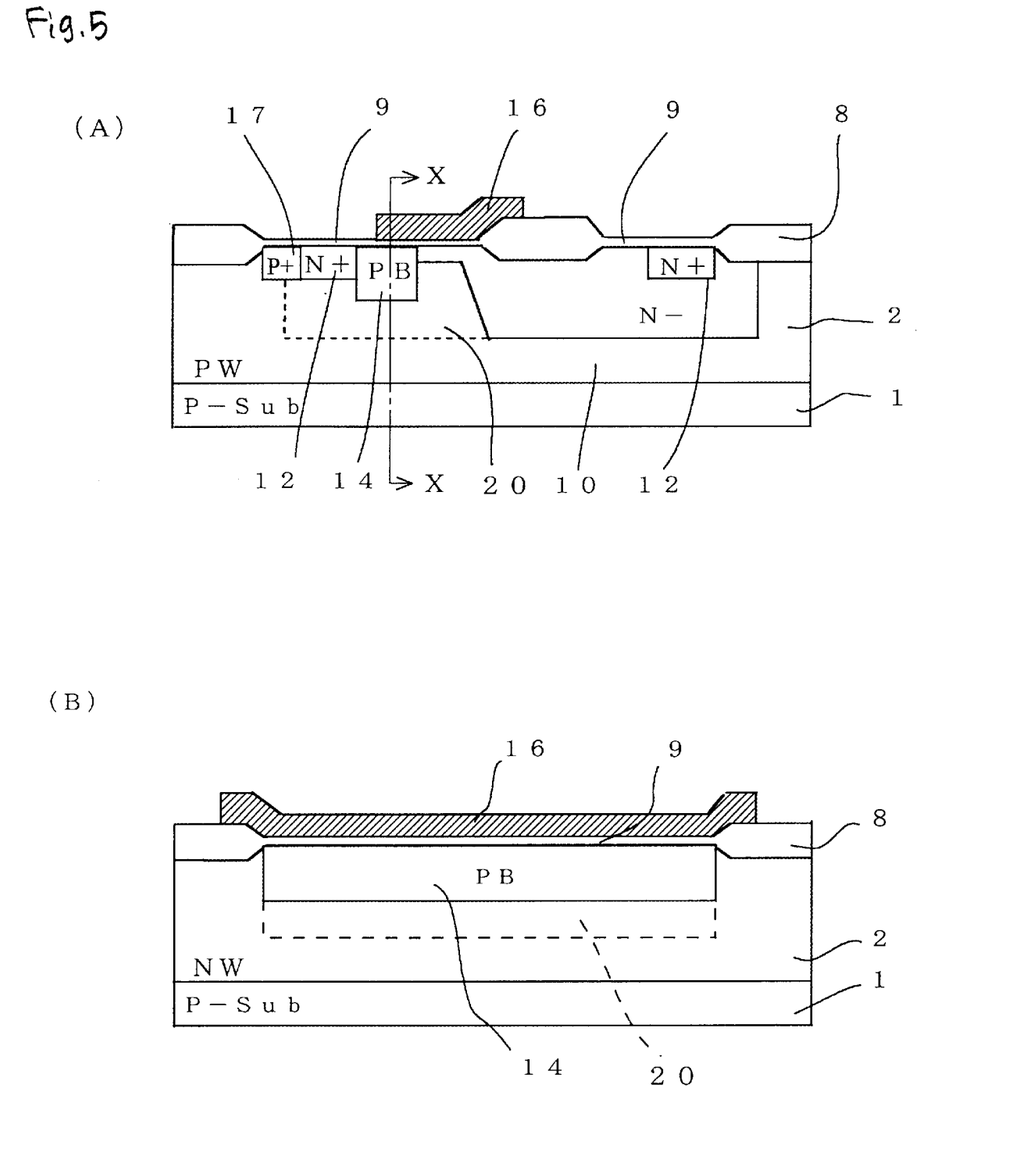

Further, in FIG. 5, a polysilicon film having a thickness of about 1000 Å is formed on the entire substrate surface. The polysilicon film is subjected to the thermal diffusion from a thermal diffusion source of $POC_3$ so that it is made conductive to have N type conductivity. On the polysilicon film, a tungsten silicide (Wsix) film having a thickness of 1000 Å and a having a thickness of 1500 Å are stacked successively. The $SiO_2$ film is used as a mask for patterning gate electrode. Using a resist film (not shown), patterning is done to form the gate electrode of each MOS transistor. Reference numeral 17 denotes a P type diffused layer for taking the potential of the P type body layer 14, which is formed at a position adjacent to the above N type source layer 12. This P type diffused layer is formed by ion-implanting boron difluoride ions with a dose of $4 \times 10^{15}/cm^2$ at an accelerating voltage of about 60 KeV Although not explained referring to the drawings, after an interlayer insulating film composed of a TEOS film and BPSG film and having a thickness of 6000 Å has been formed on the entire substrate surface, a metallic wiring layer in contact with each of the above heavily-doped N type source/drain layers 12 to complete the N-channel type MOS transistor. Although have not been explained, the P-channel type MOS transistor will be also manufactured through the same process as that of the N-channel type MOS transistor.

The structure according to the invention, in which the P type body layer 14 or N type body layer (not shown) is formed only below the gate electrode 16, can reduce the junction capacitance more greatly than the conventional structure (as shown in FIG. 7) in which the heavily doped source layer 54 is enveloped by the P type body layer 53, thereby realizing the high speed operation.

The structure according to the invention, in which the P type body layer 14 or N type body layer is formed by ion-implantation, can realize down-sizing as compared with the conventional structure.

In accordance with the manufacturing process according to the invention, the lightly-doped N type drain layer 10 is formed using the difference in the diffusion coefficient between two kinds of N type impurities having different diffusion coefficients and a kind of P type impurities having the diffusion coefficient approximately equal to or greater than the one kind of the two kinds of N type impurities. This simplifies the manufacturing process.

In the step of forming a body layer, using an ion implantation is preferable. But in another doping step not only ion implantation but also diffusing step from gas phase or solid phase can be used.

In accordance with the present invention, since the lightly-doped layer constituting a drift region is formed to be shallow at least below the gate electrode and deep in the vicinity of the drain layer, endurance to a high voltage can be improved and the ON resistance can be reduced.

The structure according to the present invention, in which the P type body layer or N type body layer is formed only below the gate electrode, can reduce the junction capacitance more greatly than the conventional structure in which the heavily doped source layer is enveloped by the P type body layer or N type body layer, thereby realizing the high speed operation.

Further, a depletion layer of the drain layer can be prevented from being enlarged by the action of the impurity ions for canceling which are implanted when the shallow layer (first N− layer) constituting the lightly doped drain layer is formed.

What is claimed is:

1. A semiconductor device comprising:
   a semiconductor layer having a first conduction type;
   heavily-doped source/drain layers having the second conduction type, which is opposite to the first conduction type, formed in the semiconductor layer;
   a gate electrode formed on a channel layer located between said source/drain layers;
   a body layer having the first conduction type formed in the vicinity of said source layer;
   and a lightly-doped drain layer having the second conductivity formed between said channel layer and drain layer,
   wherein said lightly-doped drain layer having the second conduction type is formed as a shallow portion at least below said gate electrode without a layer of the first conduction type disposed between the shallow portion and the gate electrode, and as a deep portion in the vicinity of said heavily-doped drain layer, and said body layer having the first conduction type is formed only below said gate electrode, wherein said shallow portion does not extend beyond the vertical edges of the gate electrode.

2. A semiconductor device according to claim 1, comprising:
   a gate electrode formed on a semiconductor layer having a first conduction type through a gate oxide film;
   a heavily-doped source layer having the second conduction type opposite to the first conduction type which is formed so as to be adjacent to the one end of said gate electrode;
   a heavily-doped drain layer having the second conduction type which is formed so as to be apart from the other end of said gate electrode;
   a body layer having the first conduction type which is formed between said source layer below said gate electrode and said drain layer; and a lightly-doped drain layer having the second conduction type formed in an area extending from below the gate electrode to the heavily-doped drain layer so that it is shallow at least below said gate electrode and deep in the vicinity of the heavily-doped drain layer.

3. A semiconductor device according to claim 1, wherein a width of body layer is substantially equal to that of the gate electrode.

4. A semiconductor device according to claim 1, wherein the body layer consists of an impurity region formed by ion implantation.

5. A semiconductor device according to claim 1, wherein said lightly-doped drain layer having the second conduction type comprises a lightly doped impurity region formed by canceling phosphorus ion by boron ion.

6. A semiconductor device according to claim 1, wherein said lightly-doped drain layer having the second conduction type comprises a lightly doped impurity region formed by canceling phosphorus, and said heavily doped drain layer is an impurity region mainly comprising an Arsenic ion.

7. A semiconductor device according to claim 1, wherein said lightly-doped drain layer contacts only one side of the body layer.

* * * * *